United States Patent [19]

Nakashima et al.

[11] Patent Number: 5,414,668

[45] Date of Patent: May 9, 1995

[54] SEMICONDUCTOR MEMORY DEVICE

[75] Inventors: Katsuya Nakashima; Hisanobu Tsukazaki, both of Nagasaki, Japan

[73] Assignee: Sony Corporation, Tokyo, Japan

[21] Appl. No.: 172,400

[22] Filed: Dec. 23, 1993

[30] Foreign Application Priority Data

Dec. 25, 1992 [JP] Japan .................................. 4-345779

[51] Int. Cl.[6] .................................................. G11C 7/00
[52] U.S. Cl. ................................... 365/225.7; 365/190; 365/201; 365/200
[58] Field of Search ..................... 365/200, 190, 225.7, 365/226, 227, 201

[56] References Cited

U.S. PATENT DOCUMENTS

| | | | |
|---|---|---|---|
| 4,685,086 | 8/1987 | Tran | 365/200 X |
| 4,780,851 | 10/1988 | Kurakami | 365/200 |
| 4,829,481 | 5/1989 | Johnson et al. | 365/200 |
| 5,235,548 | 8/1993 | Kurkowski | 365/200 |

Primary Examiner—Joseph A. Popek
Attorney, Agent, or Firm—Hill, Steadman & Simpson

[57] ABSTRACT

A memory device comprising a memory cell for storing data, at least one bit line connected to the memory cell, and a switch normally held in a first condition connecting the bit line to a voltage source. The switch is in a second condition disconnecting the bit line from the voltage source in the presence of a control signal. The memory device also includes a program device for producing the control signal to change the switch from the first condition to the second condition when the bit line has a leakage trouble.

5 Claims, 2 Drawing Sheets 5,414,668

SEMICONDUCTOR MEMORY DEVICE

BACKGROUND OF THE INVENTION

This invention relates to a semiconductor memory device arranged to overcome a leakage trouble.

For semiconductor memory devices such as SRAM (static random access memory) or the like having bit lines connected to a power source in a stand-by condition, a leakage trouble, such as a defective bit line operation, occurs when dust or the like causes a short circuit between one of the bit lines and the ground. It is the conventional practice to overcome such a leakage trouble by replacing the defective memory cell with a redundant memory cell. When the leakage trouble includes a defective stand-by current along with the defective bit line operation, however, it is impossible to overcome the leakage trouble merely by replacing the defective memory cell with a redundant memory cell.

SUMMARY OF THE INVENTION

It is a main object of the invention to provide an improved semiconductor memory device which can overcome a leakage trouble including a defective stand-by current. There is provided, in accordance with the invention, a memory device which comprises a memory cell for storing data, at least one bit line connected to the memory cell, and switching means normally held in a first condition connecting the bit line to a voltage source. The switching means is in a second condition disconnecting the bit line from the voltage source in the presence of a control signal. The memory device also includes program means for producing the control signal to change the switching means from the first condition to the second condition when the bit line has a leakage trouble.

In another aspect of the invention, the memory device comprises a memory cell for storing data, at least one bit line connected to the memory cell, and a first transistor held in a first condition connecting the bit line to a voltage source and in a second condition disconnecting the bit line from the voltage source in the presence of a control signal. The memory device also comprises program means for producing the control signal to change the first transistor from the first condition to the second condition when the bit line has a leakage trouble. The program means includes a second transistor connected between a first voltage and a node, a fuse connected between said node and a second voltage. The node is connected to a control electrode of the second transistor and a control electrode of the first transistor.

In still another aspect of the invention, there is provided a method for utilizing a memory device having at least one bit line connected to a voltage source. The method comprises electrically cutting off the bit line from the voltage source when the bit line has a leakage trouble.

BRIEF DESCRIPTION OF THE DRAWINGS

This invention will be described in greater detail by reference to the following description taken in connection with the accompanying drawings, in which.

DETAILED DESCRIPTION OF THE INVENTION

Figure 1:
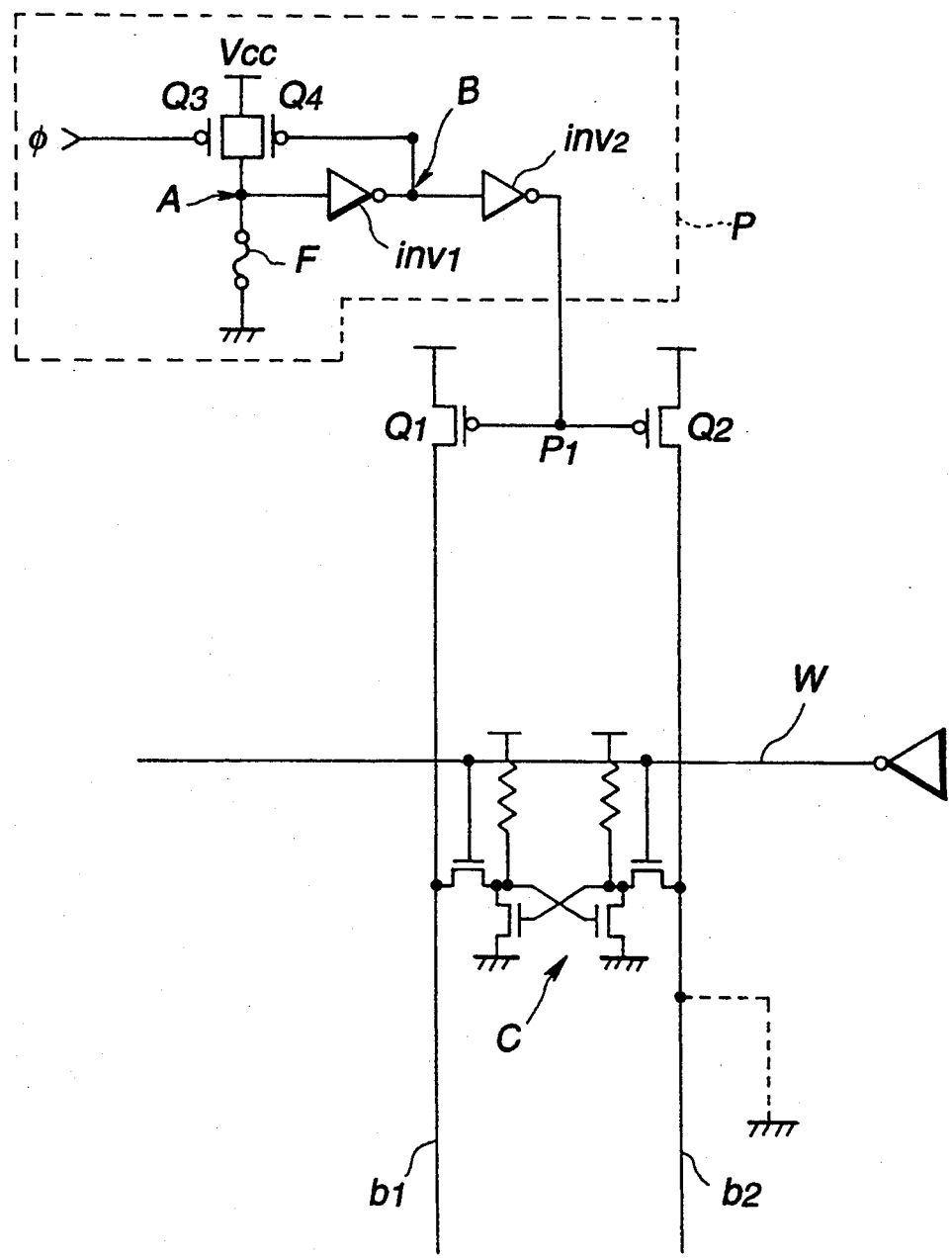
FIG. 1 is a schematic circuit diagram showing one embodiment of a semiconductor memory device made in accordance with the invention.

With reference to the drawings, and in particular to FIG. 1, there is shown a schematic diagram of a semiconductor memory device embodying the invention. The semiconductor memory device is shown in the form of a static random access memory (SRAM) having a memory cell C for storing data. The memory cell C is connected to a word line W and also to a pair of bit lines b1 and b2. The bit lines b1 and b2 are connected to a voltage source through respective switching devices taken in the form of pMOS transistors Q1 and Q2. The first pMOS transistor Q1 has its gate electrode connected at a point P1 to the gate electrode of the second pMOS transistor Q2.

The semiconductor memory device also includes a program means P having a node Φ for receipt of a reset pulse and an output coupled to the point P1 at which the gate electrodes of the first and second pMOS transistors Q1 and Q2 are connected. The program means P includes two pMOS transistors Q3 and Q4 having their source electrodes connected to a voltage source Vcc and their drain electrodes connected to a node A which, in turn, is connected to the ground through a fuse F which is broken when at least one of the bit lines b1 and b2 has a leakage trouble. The third pMOS transistor Q3 has a gate electrode connected to the node Φ. The fourth pMOS transistor Q4 has a gate electrode connected to a node B. The node A is connected to the node B through a first invertor inv1. The node B is connected through a second invertor inv2 to the point P1.

In the event of a short circuit between the bit line b2 and the ground, as indicated by the phantom lines of FIG. 1, the bit lines b1 and b2 are held at a high level voltage and the word line W is held at a low level voltage. This leads to a leakage trouble where a leakage current flows and causes a defective stand-by current often a long with a defective bit line operation. The leakage trouble cannot be eliminated merely by replacing the memory cell with a redundant memory cell. The invention can eliminate the leakage trouble by breaking the fuse F provided in the program means P. When the fuse F is broken, the first and second pMOS transistors Q1 and Q2 are turned off to interrupt the supply of current to the bit lines b1 and b2.

Figure 2:
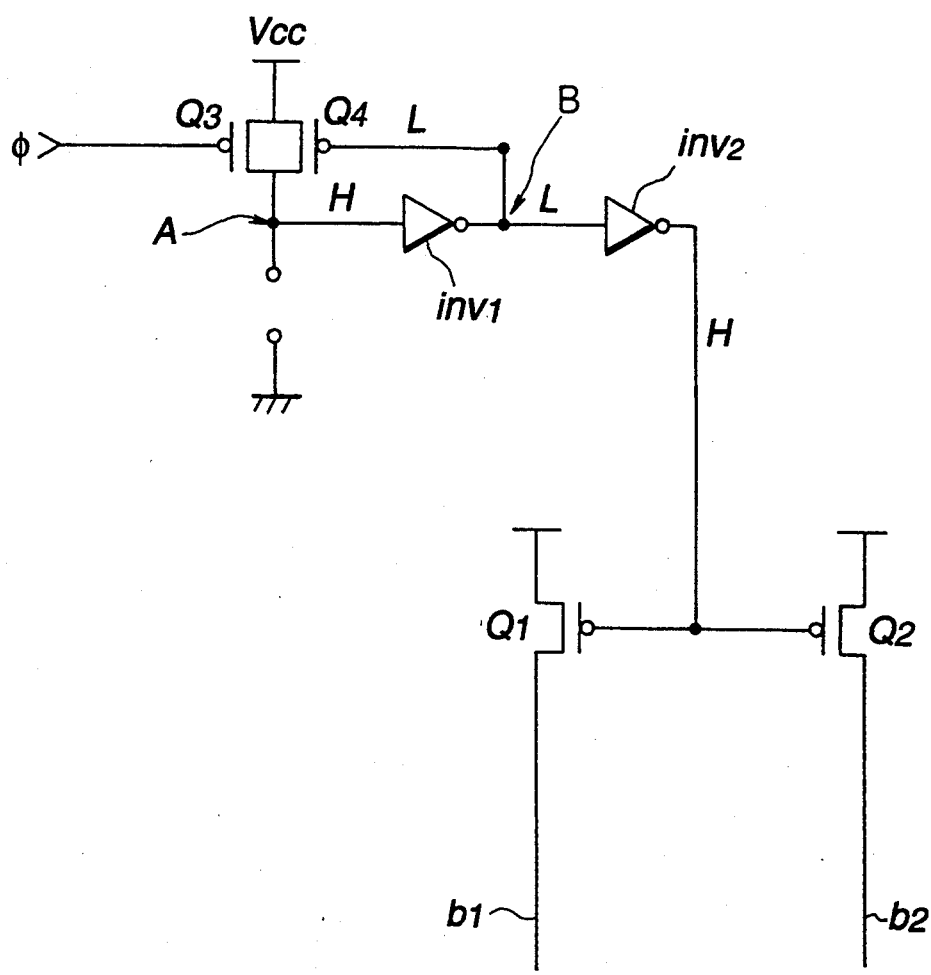
FIG. 2 is a schematic circuit diagram used in explaining the operation of the semiconductor memory device of FIG. 1.

Referring to FIG. 2, the semiconductor memory device is shown with the fuse F being broken. In this case, a "H" (high) level voltage appears at the node A because of an unshown capacity. As a result, the output of the first invertor inv1 goes to an "L" (low) level. The output of the second invertor inv2, which receives the "H" level voltage, goes to a "H" level. The "H" level voltage is applied from the second invertor inv2 to the gate electrodes of the pMOS transistors Q1 and Q2 to prevent current from flowing from the voltage source to the bit lines b1 and b2. Since the output of the invertor inv1 remains at an "L" level, the gate electrode of the fourth pMOS transistor Q4 is held at an "L" level to permit current flow from the voltage source Vcc to the node A. This condition is held.

If the rate of increase of the voltage at the voltage source is very small when the semiconductor memory device is powered, however, the voltage at the node A remains at an "L" level in spite of breakage of the fuse F so that the program means P cannot operate to avoid the defective stand-by current. For this reason, a reset pulse is applied to the node Φ, causing a current to flow so as to change the voltage at the node A to a "H" level in spite of the fact that the voltage at the node A is intermediate between the "H" and "L" levels when the semiconductor memory device is powered. As a result, the output of the program means P changes to a "H" level to turn the first and second pMOS transistors Q1 and Q2 off substantially at the same time as the semiconductor memory device powered.

While the invention has been described connection with a SRAM, it is to be understood, of course, that the invention is also applicable to other semiconductor memory devices such as dynamic random access memories (DRAM). While the invention has been described in connection with a single program means P provided for a pair of bit lines b1 and b2, it is to be understood that a single program means may be provided for 16 columns when the memory cell is replaced with a redundant memory cell. While the invention has been described in connection with a program means P provided with a fuse F to be broken so as to turn the first and second pMOS transistors Q1 and Q2 off, it is to be understood that E²PROM cells or other various means may be used to obtain the same effect.

While this invention has been described in conjunction with a specific embodiment thereof, it is evident that many alternatives, modifications and variations will be apparent to those skilled in the art. Accordingly, it is intended to embrace all alternatives, modifications and variations that fall within the scope of the appended claims.

What is claimed is:

1. A memory device comprising:
   a memory cell for storing data;
   at least one bit line connected to said memory cell;
   switching means normally held in a first condition connecting said bit line to a voltage source, said switching means being in a second condition disconnecting said bit line from said voltage source in the presence of a control signal;
   program means for producing the control signal to change said switching means from the first condition to the second condition when said bit line has a leakage trouble, said program means incorporating a fuse connected between a fuse node and ground, and at least one inverter to produce said control signal and having all input connected to said fuse node.

2. A memory device according to claim 1, wherein said program means includes a fuse to be broken when said bit line has a leakage trouble, and means for producing the control signal when said fuse is broken.

3. A memory device comprising:
   a memory cell for storing data;
   at least one bit line connected to said memory cell;
   a first transistor held in a first condition connecting said bit line to a voltage source, said first transistor being in a second condition disconnecting said bit line from said voltage source in the presence of a control signal; and
   program means for producing the control signal to change said first transistor from the first condition to the second condition when said bit line has a leakage trouble, said program means including a second transistor connected between a first voltage and a node, a fuse connected between said node and ground, said node being connected to a control electrode of said second transistor and a control electrode of said first transistor.

4. A memory device comprising:
   a memory cell for storing data;
   at least one bit line connected to said memory cell;
   switching means normally held in a first condition connecting said bit line to a voltage source, said switching means being in a second condition disconnecting said bit line from said voltage source in the presence of a control signal;
   program means for producing the control signal to change said switching means from the first condition to the second condition when said bit line has a leakage trouble, wherein said program means includes means for producing a reset pulse when said bit line has a leakage trouble, and means responsive to the reset pulse for producing the control signal.

5. A memory device comprising:
   a memory cell for storing data;
   at least one bit line connected to said memory cell;
   a first transistor held in a first condition connecting said bit line to a voltage source, said first transistor being in a second condition disconnecting said bit line from said voltage source in the presence of a control signal;
   program means for producing the control signal to change said first transistor from the first condition to the second condition when said bit line has a leakage trouble, said program means including a second transistor connected between a first voltage and a node, a fuse connected between said node and a second voltage, said node being connected to a control electrode of said second transistor and a control electrode of said first transistor; and
   wherein said program means comprises a third transistor connected between said first voltage and said node in parallel with said second transistor, said third transistor having a control electrode for receipt of a reset pulse when said memory device is powered.

* * * * *